United States Patent
David

(10) Patent No.: US 7,392,339 B2
(45) Date of Patent: Jun. 24, 2008

(54) PARTIAL BANK DRAM PRECHARGE

(75) Inventor: Howard S. David, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 298 days.

(21) Appl. No.: 10/732,635

(22) Filed: Dec. 10, 2003

(65) Prior Publication Data

US 2005/0132131 A1    Jun. 16, 2005

(51) Int. Cl.
*G06F 12/00*    (2006.01)

(52) U.S. Cl. .................................... 711/106; 711/5

(58) Field of Classification Search ............... 711/106; 365/222
See application file for complete search history.

(56) References Cited

U.S. PATENT DOCUMENTS

| | | | | |
|---|---|---|---|---|
| 5,627,791 A * | 5/1997 | Wright et al. | ............... | 365/222 |
| 5,805,516 A * | 9/1998 | Madurawe | ................... | 365/204 |
| 6,075,744 A * | 6/2000 | Tsern et al. | ............ | 365/230.03 |
| 6,195,303 B1 * | 2/2001 | Zheng | ........................ | 365/222 |
| 6,590,822 B2 * | 7/2003 | Hwang et al. | ............... | 365/222 |
| 6,665,224 B1 * | 12/2003 | Lehmann et al. | ............ | 365/222 |
| 6,738,861 B2 * | 5/2004 | Lawrence | ................... | 711/106 |
| 6,819,617 B2 * | 11/2004 | Hwang et al. | ............... | 365/222 |
| 6,871,261 B1 * | 3/2005 | Proebsting | .................. | 711/106 |
| 2003/0056067 A1 * | 3/2003 | Lawrence | ................... | 711/156 |
| 2003/0086325 A1 * | 5/2003 | Lee et al. | ..................... | 365/222 |
| 2003/0193829 A1 * | 10/2003 | Morgan et al. | .............. | 365/222 |
| 2003/0218930 A1 * | 11/2003 | Lehmann et al. | ............ | 365/222 |
| 2004/0068604 A1 * | 4/2004 | Le et al. | ........................ | 711/5 |
| 2004/0093461 A1 * | 5/2004 | Kim | ............................ | 711/106 |
| 2005/0068826 A1 * | 3/2005 | Hoehler | ...................... | 365/203 |

* cited by examiner

*Primary Examiner*—Matthew Kim
*Assistant Examiner*—Ryan Dare
(74) *Attorney, Agent, or Firm*—Pillsbury Winthrop Shaw Pittman LLP

(57) ABSTRACT

A "partial PRECHARGE command" is used to precharge a fraction of the banks in a multi-bank DRAM. In a first implementation the command precharges one half of the banks. In a second implementation the command precharges one quarter of the banks. The power drawn by the upper or lower bank precharge on the eight bank DRAM is the same as the power drawn by an "all bank" precharge on a four bank DRAM, without requiring the precharge period to be extended.

29 Claims, 5 Drawing Sheets

PARTIAL BANK DRAM PRECHARGE

RELATED APPLICATIONS

The instant patent application is related to U.S. patent application Ser. No. 10/713,486, filed on Nov. 14, 2003 the disclosure of which is hereby incorporated by reference in its entirety.

BACKGROUND OF THE INVENTION

1. Field of the Invention

The present invention relates to dynamic random access memory (DRAM), and in particular to precharging techniques.

2. Discussion of the Related Art

Memory devices are widely used in many electronic products and computers to store data. A memory device includes a number of memory cells. A DRAM device operates by storing charge on a capacitor at each memory location. Ultimately, the capacitor loses the charge over time and therefore needs to be periodically refreshed to its original level, a 1 or 0. All of the memory cells must be refreshed within one refresh period, $t_{REF}$, which may be for example 64 ms. Refreshing is accomplished by doing a row access for every row in the memory device. In a refresh cycle, all of the capacitors in one or more rows are first read, and then written back to, restoring full charge to the capacitor. An open row of a bank must be precharged prior to being refreshed. The rows and columns of a DRAM device may be partitioned into multiple banks to reduce the large DRAM arrays into smaller segments.

As the number of storage cells per memory bank, and the number of memory banks per device increases, the number and duration of refresh commands issued by a memory controller also increases. Since all of the open banks must be closed (precharged) before a refresh command can be issued, the number of "precharge all" commands issues by a memory controller also increases. This ultimately results in a precharge and refresh overhead that unacceptably impacts the performance of normal memory accesses. The main precharge overhead is the penalty paid in closing pages that might otherwise be left in their open, lower latency state. A secondary penalty is that as the number of banks grows, additional clocks may be added to the time required for a precharge.

In order to reduce the precharge overhead, it may be desirable to precharge a fraction of the banks for each precharge command. This approach may be called partial multibank precharge. With a given precharge command, a fraction of the banks may be either simultaneously or sequentially precharged. To maximize overall system performance it may be more desirable to precharge banks simultaneously in order to minimize the time that bank resources are tied up. A partial multibank precharge is particularly useful when combined with a partial multibank refresh. Only the particular fraction of the memory device that is to be refreshed is precharged, with the remaining fraction left in its current state.

Additionally, as DRAM devices become larger, the time required from the refresh command until the next command, the AUTO-REFRESH command period $t_{RFC}$, grows substantially. The impact of increased $t_{RFC}$ is an increase in the read latency of read requests that occur during the refresh itself. Again, a row must be precharged prior to being refreshed. Therefore, the time required to precharge a row, $t_{RP}$, may also lead to an increase in the read latency of read requests that occur during the precharge. For a DRAM device with a larger number of banks, there will be times when the read and write activity is skewed to one portion or another of the DRAM. Performance may be improved if precharges and refreshes are done opportunistically to the portion of the DRAM not in use, with concurrent read or write operations to the remaining portion of the DRAM.

As microprocessor speed increases, memory access speed must also increase. At the same time, the number of memory banks per memory device continues to increase, for example from four banks to eight banks to sixteen banks. Using current DRAM technology, the "precharge" command causes one bank of the DRAM to be precharged, and the "precharge all" command causes all of the banks of the DRAM to be precharged. This also requires the closing of all open pages, i.e., open rows. With multi-bank memories more locations need to be precharged at any given time, and precharging draws more power in a shorter time for the larger multi-bank memories. Therefore, either the current required for an all-bank precharge operation will be roughly double, for example, for eight banks as compared to four banks, or the time required to perform the precharge operation will be somewhat longer as compared to the four bank precharge. Thus, current spikes can cause significant noise problems on the power line during a precharge operation, and a longer precharge/refresh will increase the latency of any reads that are waiting for the precharge/refresh to complete. Current DRAM devices do include a precharge command that is given to just one bank of the DRAM. But when refreshing four or eight banks of a DRAM, it would be very inefficient to issue four or eight of these single bank precharge commands ahead of the refresh command.

Accordingly, current precharge protocols limit precharging to one row at a time in order to control precharging noise. What is needed is a partial precharge command that precharges a fraction of the banks of a DRAM device per command.

DETAILED DESCRIPTION

Figure 1:
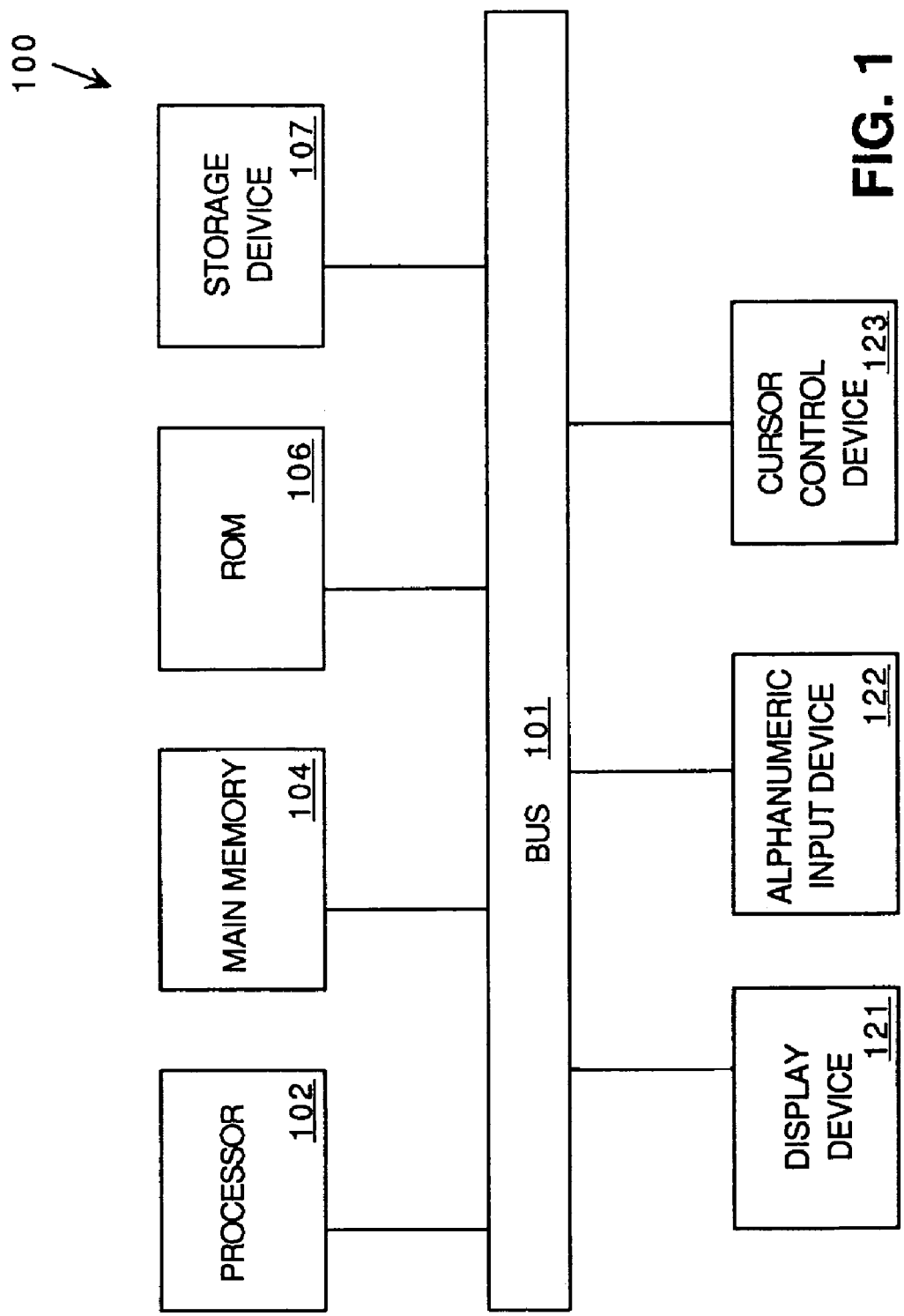
FIG. 1 illustrates a block diagram of a computer system suitable for use with an embodiment of the invention.

The present invention improves the performance of memory subsystems by providing a method to precharge a fraction of the banks in a DRAM in response to a given precharge command in preparation for refreshing the fraction of the banks in the DRAM. Related U.S. patent application Ser. No. 10/713,486 describes a method to refresh a fraction of the banks in a DRAM in response to a given refresh command.

Precharging a fraction of the banks allows a degree of concurrency with reads and/or writes to the remaining banks in the DRAM which are not being precharged. Additional performance may be gained because it is not necessary to close the pages of the banks that are not being precharged, potentially reducing the read latency to the data in those banks. In embodiments of the present invention each precharge command precharges half of the banks in the DRAM in preparation for refreshing the fraction of the banks. In one embodiment, each precharge command does half as much work as an all-bank precharge command (closing up to one row per bank, but for only half of the banks.)

As the number of banks per memory device increases and as the number of devices in memory systems increases, the number of precharge and refresh commands issued by a controller also increases. This ultimately results in a precharge and refresh overhead that unacceptably impacts the performance of normal memory accesses as measured by effective data bandwidth and memory access latency.

In typical DRAMs, data is not directly transmitted from the storage cells. Rather, data may be transferred to sense amplifiers prior to transmission. The sense amplifiers may only store one row of data. If an operation is to be performed on a row of data other than the currently accessed row, two operations must be performed. The first operation, a precharge operation, occurs when pairs of bit lines within the memory are equalized to a midpoint voltage level. Secondly, a sense operation occurs when data in the row on which the operation is to be performed is transferred to the sense amplifiers. The DRAM device is said to be in a closed state between the precharge operation and the subsequent sense operation. At all other times, the DRAM is said to be in an open state.

A row access operation is performed in four steps. First, a row is opened, or turned on, in the sense operation. Turning on a row of transistors that connect one row of storage cells to one row of sense amps has the effect of draining most of the charge from the storage cells, which in turn moves the bit lines slightly away from their precharged neutral level. Second, after the sense amps have reached their stable level, another set of transistors are turned on which allow the sense amps to re-drive full data levels (0 or 1) on to the bit lines. The storage cells are also restored (refreshed) to their full levels. Third, the transistors that connect the storage cells to the bit lines are shut off, and the page is considered closed. Finally, the bit lines are returned to their neutral Vdd/2 voltage by performing the precharge operation, using a precharge equalization transistor. If a refresh operation is performed, there is no need to select a particular bit with a column address. Further, data is not read at the pins of the device.

As discussed above, a problem caused by all-bank precharging is the generation of current spikes. Each precharge operation for each bank requires a certain amount of supply current over time. With all-bank precharging, multiple banks simultaneously conduct a row precharge, thus, the current spike effect may be additive causing greater probability of circuit failure.

The present invention implements precharging a fraction of the banks for each precharge command to reduce precharge overhead on the memory system bus. This approach is called partial multibank precharging. With a given precharge command, either a fraction of the banks are simultaneously precharged, or a fraction of the banks are sequentially precharged from the same command. To maximize overall system performance it may be more desirable to precharge banks simultaneously in order to minimize the time that bank resources are tied up.

FIG. 1 is a block diagram of a computer system suitable for use with the invention. Computer system 100 comprises bus 101 or other device for communicating information, and processor 102 coupled with bus 101 for processing information. Computer system 100 further includes synchronous dynamic random access memory (SDRAM) or other dynamic storage device 104 (referred to as main memory), coupled to bus 101 for storing information and instructions to be executed by processor 102. Main memory 104 also can be used for storing temporary variables or other intermediate information during execution of instructions by processor 102. Computer system 100 also comprises read only memory (ROM) and/or other static storage device 106 coupled to bus 101 for storing static information and instructions for processor 102. Data storage device 107 is coupled to bus 101 for storing information and instructions.

Data storage device 107 such as magnetic disk or optical disc and corresponding drive can be coupled to computer system 100. Computer system 100 can also be coupled via bus 101 to display device 121, such as a cathode ray tube (CRT) or liquid crystal display (LCD), for displaying information to a computer user.

Alphanumeric input device 122, including alphanumeric and other keys, is typically coupled to bus 101 for communicating information and command selections to processor 102. Another type of user input device is cursor control 123, such as a mouse, a trackball, or cursor direction keys for communicating direction information and command selections to processor 102 and for controlling cursor movement on display 121.

In one embodiment, processor 102 and one or more of the components coupled to bus 102, such as main memory 104, are source synchronous components. Of course, any one or more components of computer system 100 can be source synchronous. Thus, computer system 100 can be either a partially source synchronous or fully source synchronous environment. In one embodiment, computer system 100 is a differential-strobe source synchronous system in which complementary strobe signals are communicated in parallel with data signals over the bus. Alternatively, computer system 100 is a single-strobe source synchronous system in which a single strobe signal is communicated in parallel with data signals over the bus.

The 16 Mb generation of DRAM consisted of a single bank of memory, so that each refresh command would cause one row of the DRAM to be refreshed. With the introduction of the 64 Mb generation of synchronous DRAM (SDRAM), devices with four banks became available. DRAM performance was improved because a large degree of concurrency was allowed between the banks. The 64 Mb DRAM were designed so that each refresh command would refresh 4 rows of memory, one row in each bank. The time to perform the 4 refreshes, $t_{RFC}$=72-80 ns, was longer than the time for a single activate plus read/write cycle, to allow the refreshes to be staggered internally. The staggering prevents the large current spike that would occur if all banks were refreshed at exactly the same time. For the 64 Mb SDRAM, the refresh period $t_{REF}$ was 64 ms, while the average time between refreshes $t_{REFI}$ was 15.6 us.

The 4-bank 256 Mb generation of double data rate SDRAM (DDR SDRAM) doubled the size of the row (the page size) relative to the 64 Mb generation, from 512 B to 1 KB, and doubled the number of rows (8192) in the device relative to the 64 Mb generation (4096), but left the basic operation unchanged: each refresh command caused one row of each bank to be refreshed. Since twice as many rows needed to be refreshed in the refresh period $t_{REF}$ (64 ms), the average time between refreshes (the refresh interval) $t_{REFI}$ was reduced from 15.6 us to 7.8 us, in going from the 64 Mb to the 256 Mb generation.

The 4-bank 512 Mb generation of DDR SDRAM doubled the size of each row relative to the 256 Mb generation, from 1 KB to 2 KB. Compared to the 256 Mb generation, the refreshes are the same, i.e., each refresh command refreshes all four banks, with a refresh interval $t_{REFI}$ of 7.8 us. The larger page size does require a larger current to perform the refresh.

For the 4-bank 256 Mb generation, DDR and DDR2 (second generation) SDRAM have the same number of rows and banks, the same page size, and the same refresh requirements. However, starting with the 4-bank 512 Mb generation, DDR2 SDRAM has been defined with a different combination of page size, number of rows, and number of banks, compared to DDR SDRAM. The 4-bank 512 Mb generation of DDR2 SDRAM achieves its doubling of capacity by doubling the number of rows in each bank (16384), while leaving the page size fixed at 1 KB. Each refresh command causes two rows to be refreshed in each bank of memory. This is possible because there are actually multiple sets of sense amplifiers in each bank of memory.

The maximum number of rows of a bit line inside the DRAM is physically limited to around 512 (2^9 bits). A DDR2 512 Mb SDRAM has 14 row bits, which means there are 2^(14-9)=32 sets of sense amplifiers in each bank. These 32 sets are logically wired together to form one bank, so that reading or writing is normally only allowed to one row of a bank at a time. Allowing two sets of sense amplifiers within the same bank to be used to refresh two rows within the same bank at mostly the same time may require a small change to the circuitry that connects the 32 sets of sense amplifiers. The total time for the refresh, $t_{RFC}$ (105 ns), is increased.

The 8-bank 1 Gb generation achieves its doubling of capacity by doubling the number of banks, from 4 to 8, so that each refresh command must cause two rows to be refreshed in each bank to be refreshed, with a total of 16 rows to be refreshed for each refresh command. The total time for the refresh, $t_{RFC}$ (127.5 ns), is increased to keep the current requirements roughly the same as the 512 Mb generation.

The 8-bank 2 Gb generation achieves its doubling of capacity by doubling the number of rows in each bank (32768), so that each refresh command must cause 4 rows to be refreshed in each bank to be refreshed, with a total of 32 rows to be refreshed for each refresh command. The total time for the refresh, $t_{RFC}$ (195 ns), is also increased to keep the current requirements roughly the same as the 1 Gb generation.

The memory industry has not yet decided how the 4 Gb generation will achieve its doubling of capacity, i.e., it can be achieved by doubling either the page size, the number of rows, or the number of banks. If the refresh current is to stay roughly the same for the 4 Gb generation, there will be either an increase in $t_{RFC}$ or a decrease in $t_{REFI}$, relative to the 2 Gb generation.

Figure 2:
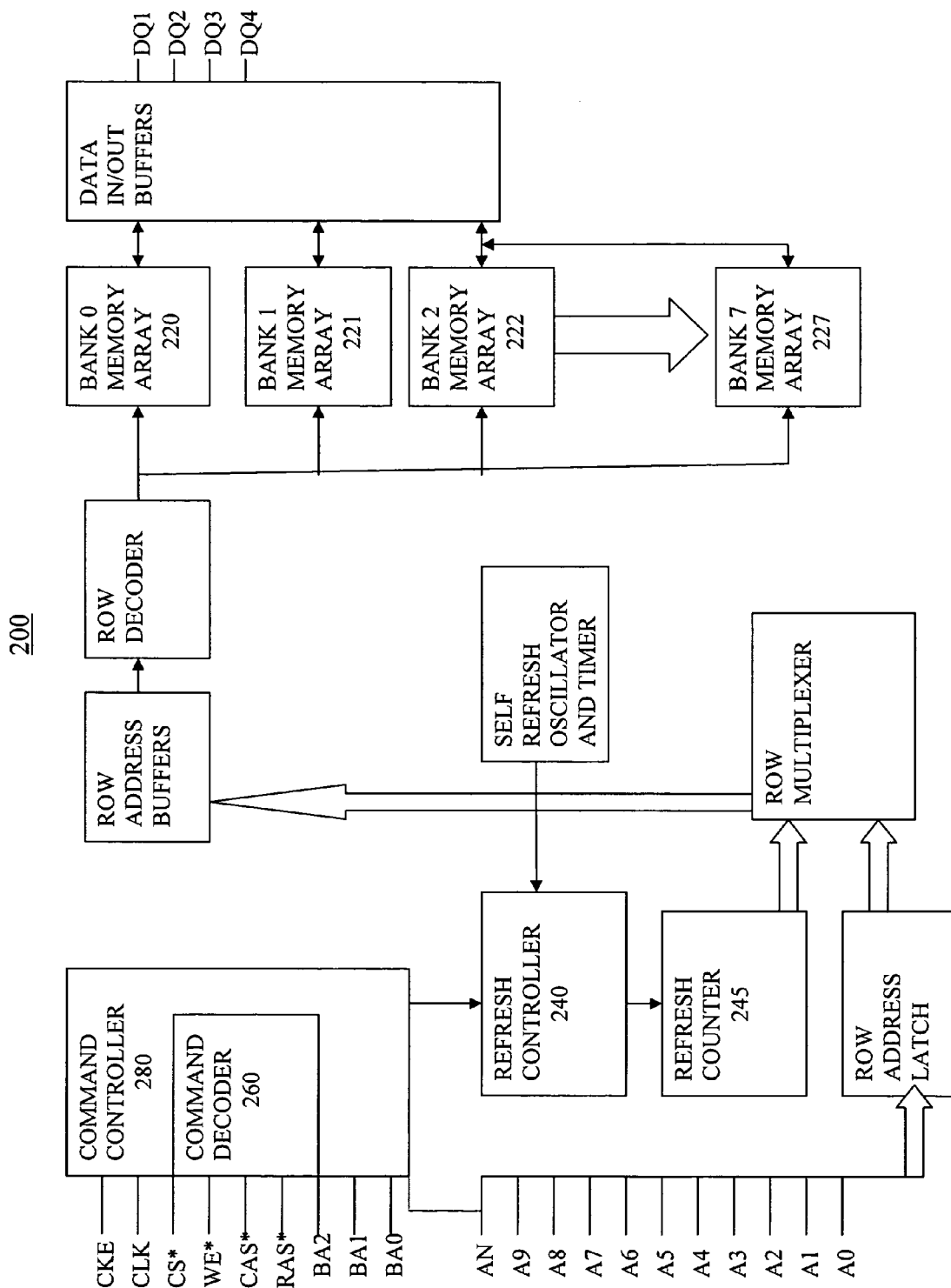
FIG. 2 illustrates a block diagram of a SDRAM according to an embodiment of the present invention.

A synchronous dynamic random access memory (SDRAM) according to embodiments of the present invention is illustrated generally at 200 in FIG. 2 in block diagram form. The present invention is not limited to SDRAMs, as the present invention is equally applied to other types of memory devices. Only the circuitry relevant to the current discussion is shown. As illustrated in FIG. 2, SDRAM 200 may include 8 memory bank arrays, a bank 0 memory array 220 up to a bank 7 memory array 227 which all comprise storage cells organized in rows and columns for storing data.

A system clock (CLK) signal is provided through a CLK input pin and a clock enable signal (CKE) is provided through a CKE input pin to SDRAM 200. The CLK signal is activated and deactivated based on the state of the CKE signal. All the input and output signals of SDRAM 200, with the exception of the CKE input signal during power down and self refresh modes, are synchronized to the active going edge of the CLK signal (See also FIG. 3).

A chip select (CS*) input pin inputs a CS* signal which enables, when low, and disables, when high a command decoder 260. The command decoder 260 is included in a command controller 280. The command decoder 260 receives control signals including a row access strobe (RAS*) signal on a RAS* pin, column access strobe (CAS*) signal on a CAS* pin, and a write enable (WE*) signal on a WE* pin. The command decoder 260 decodes the RAS*, CAS*, and WE* signals to place the command controller 280 in a particular command operation sequence. The command controller 280 controls the various circuitry of SDRAM 200 based on decoded commands such as during controlled reads or writes from or to bank 0 memory array 220 through bank 7 memory array 227. Bank address signals (BA0, BA1, BA2) provided on separate BA input pins define which of at least one memory bank array should be operated on by certain commands issued by the command controller 280. Address signal A10 along with bank address signals (BA0, BA1, BA2) together define which of at least one memory bank array should be precharged according to a precharge command issued by the command controller 280.

Address inputs bits are provided on input pins A0-AN. Current DDR and DDRII specifications define up to 16 address pins, A0-A15. For example, 1 Gb SDRAM devices use input pins A0-A113. The row and column address input bits are multiplexed on the address input pins. During write transfer operations, data is supplied to SDRAM 200 via input/output pins (DQ1-DQ4). During read transfer operations, data is clocked out of SDRAM 200 via input/output pins DQ1-DQ4.

SDRAM 200 must be powered-up and initialized in a predefined manner. In addition, all memory bank arrays 220-227 must be precharged and placed in an idle state. The precharging of the memory bank arrays is preformed with a PRECHARGE command operation.

An PRECHARGE command is initiated by registering CS*, RAS* and WE* low with CAS* high. The PRECHARGE command is non-persistent, and therefore must be issued each time a precharge is required. Addressing of a row to be precharged is determined by command controller 280. The row to be precharged in a bank always corresponds to the last row which was activated in that bank. If the row is already in its precharged (closed) state, then no further action is required for that row.

Figure 3:
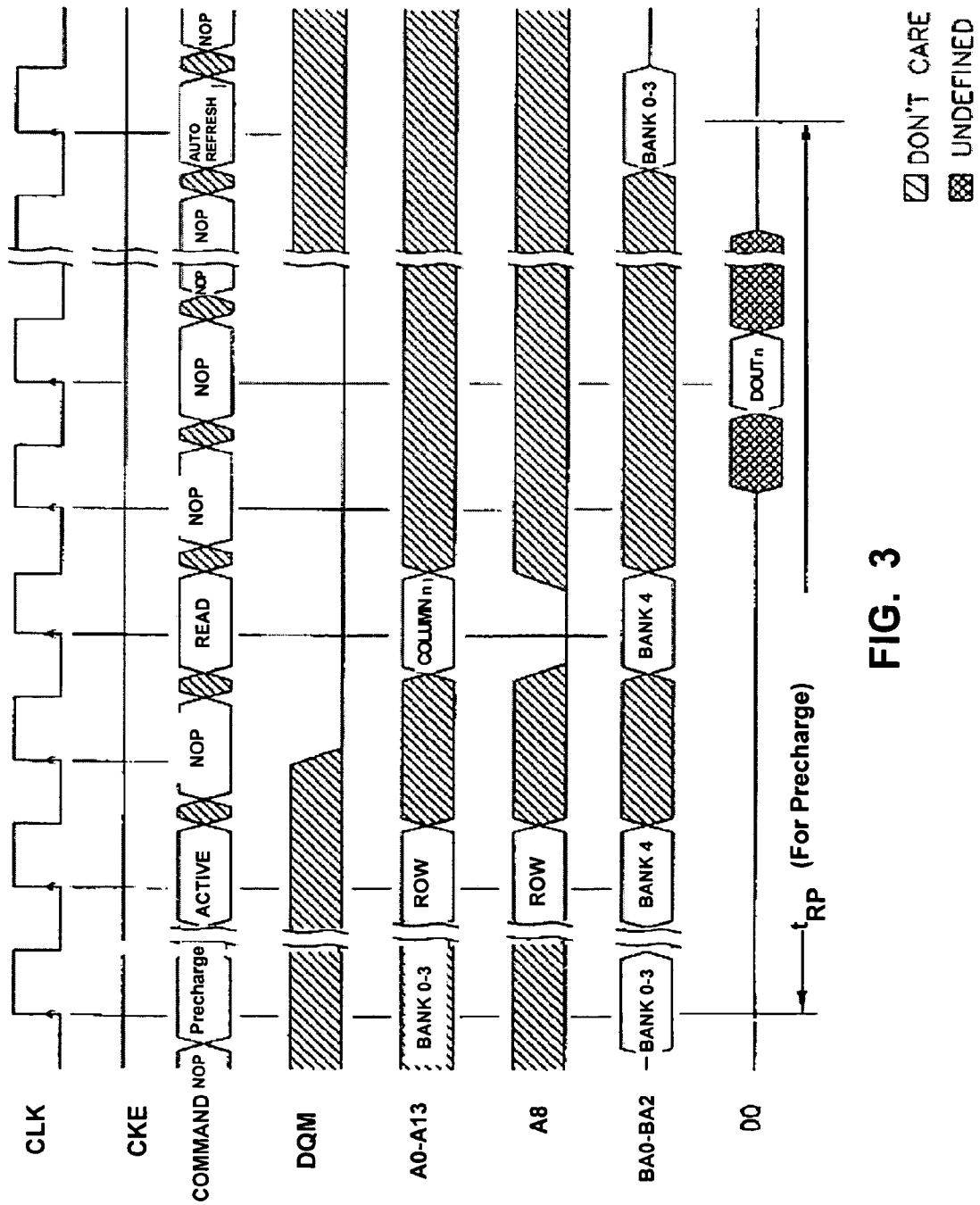
FIG. 3 is a timing diagram illustrating a precharge operation.

A precharge operation in one embodiment of SDRAM 200 performed in a memory bank array specified by the address signal A10 and the BA signals (BA0, BA1, BA2) during a PRECHARGE command is illustrated in timing diagram form in FIG. 3. As indicated in FIG. 3, each PRECHARGE command in this embodiment of SDRAM 200 is to at least one memory bank array specified by the state of the address signal A10 and the BA signals (BA0, BA1, BA2) provided on the A10 address pin and BA pins. In embodiments of the present invention, other commands may be performed on the memory bank arrays not being precharged.

A new "partial PRECHARGE command" is defined in Table A for SDRAM with eight banks. For these eight bank SDRAM parts, a PRECHARGE command with address A10 driven high, and with BA2 driven high, and BA0 driven low, will cause the lower four banks of the DRAM to be precharged. A PRECHARGE command with address A10 driven high, and with BA2 driven high, and BA0 driven high, will cause the upper four banks of the DRAM to be precharged. A PRECHARGE command with address A10 driven high, and BA2 driven low, will cause all of the banks to be precharged (for compatibility with earlier DRAM technologies.)

Although this multibank addressing scheme naturally supports the most straight-forward sequential address assignment to banks, other assignments are applicable.

TABLE A

| A10 | BA0 | BA1 | BA2 | Precharged Bank(s) |
|---|---|---|---|---|
| LOW | LOW | LOW | LOW1 | Bank 0 only |
| LOW | HIGH | LOW | LOW1 | Bank 1 only |
| LOW | LOW | HIGH | LOW1 | Bank 2 only |
| LOW | HIGH | HIGH | LOW1 | Bank 3 only |
| LOW | LOW | LOW | HIGH | Bank 4 only |
| LOW | HIGH | LOW | HIGH | Bank 5 only |
| LOW | LOW | HIGH | HIGH | Bank 6 only |
| LOW | HIGH | HIGH | HIGH | Bank 7 only |
| HIGH | DON'T CARE | DON'T CARE | LOW[1] | All Banks |
| HIGH | LOW | LOW | HIGH | Banks 0~3 |
| HIGH | HIGH | LOW | HIGH | Banks 4~7 |
| HIGH | DON'T CARE | HIGH | HIGH | Reserved |

Note 1:
BA2 = DON'T CARE for four bank devices

The advantages of the present invention are two fold. The power drawn by the upper or lower bank precharge on the eight bank part will be the same as the power drawn by an "all bank" precharge on a four bank part, without requiring the precharge period to be extended in time. This eliminates the problem that precharging eight banks simultaneously would ordinarily cause an instantaneous current draw that exceeds the limits of the package and die.

In addition, the upper/lower PRECHARGE command allows half of the banks to remain open and accessible for reads and writes during the precharge of the other half of the banks. Furthermore, the precharge time is left equal to the precharge time for a four bank device, minimizing the chance of a large queue of read requests to be waiting for the precharge to complete.

An additional embodiment of the present invention defines the partial PRECHARGE command to cause either one fourth of the banks to be precharged, or optionally, all of the banks to be precharged (for compatibility with earlier DRAM technologies.) Table B below indicates how such a command is implemented for an 8-bank SDRAM. Again, this multibank addressing scheme naturally supports the most straight-forward sequential address assignment to banks, other assignments are applicable.

TABLE B

| A10 | BA0 | BA1 | BA2 | Precharged Bank(s) |
|---|---|---|---|---|
| LOW | LOW | LOW | LOW1 | Bank 0 only |
| LOW | HIGH | LOW | LOW1 | Bank 1 only |
| LOW | LOW | HIGH | LOW1 | Bank 2 only |
| LOW | HIGH | HIGH | LOW1 | Bank 3 only |
| LOW | LOW | LOW | HIGH | Bank 4 only |
| LOW | HIGH | LOW | HIGH | Bank 5 only |
| LOW | LOW | HIGH | HIGH | Bank 6 only |
| LOW | HIGH | HIGH | HIGH | Bank 7 only |
| HIGH | DON'T CARE | DON'T CARE | LOW | All Banks |
| HIGH | LOW | LOW | HIGH | Banks 0~1 |
| HIGH | HIGH | LOW | HIGH | Banks 2~3 |
| HIGH | LOW | HIGH | HIGH | Banks 4~5 |
| HIGH | HIGH | HIGH | HIGH | Banks 6~7 |

The present invention is extendable to a 16-bank SDRAM. The general case is a PRECHARGE command that causes "M banks" to be precharged on an "N bank" DRAM.

Figure 4:
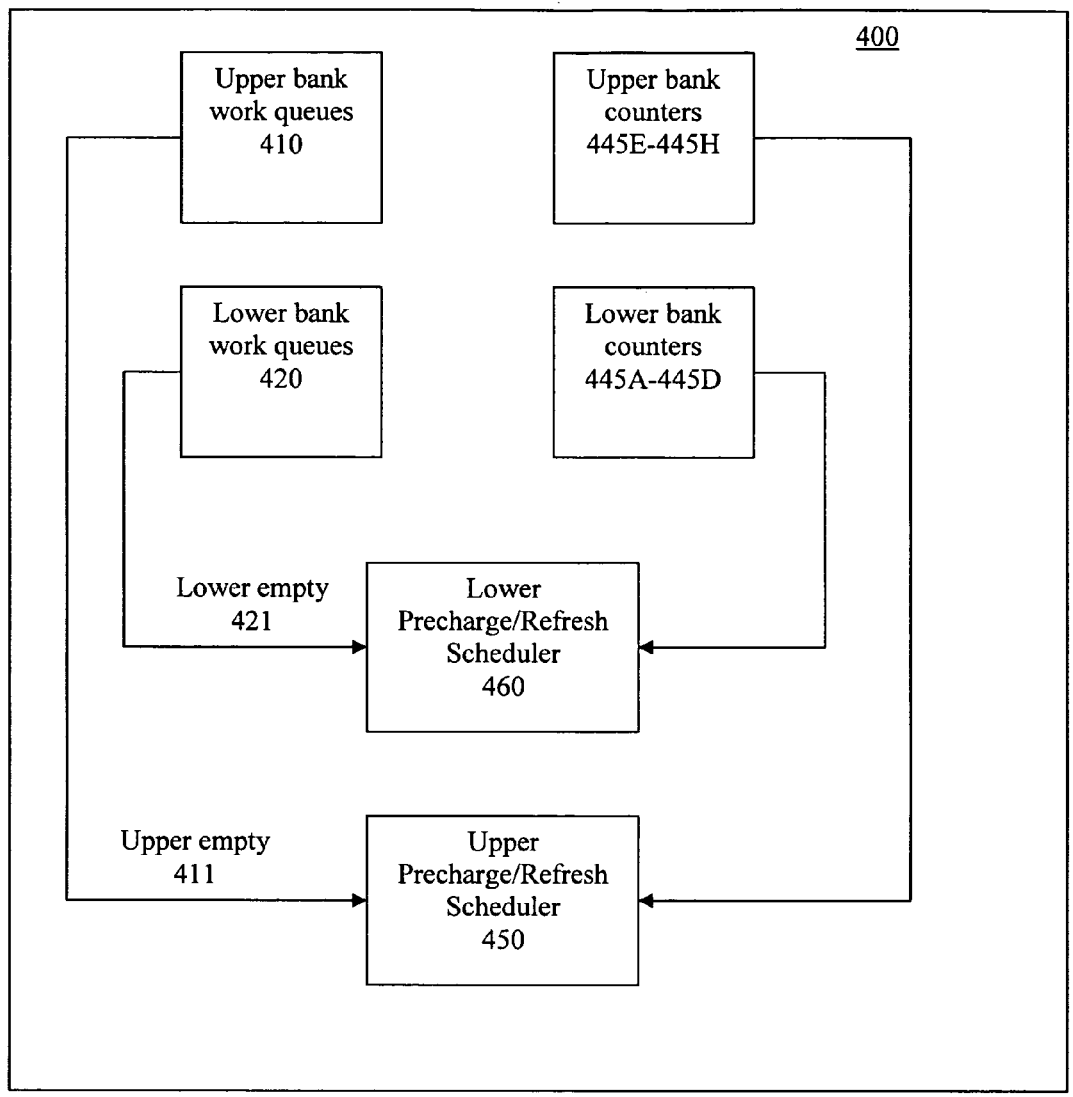
FIG. 4 illustrates a memory controller according to an embodiment of the present invention.

FIG. 4 illustrates a memory controller according to an embodiment of the present invention. Memory controller 400 maintains separate work queues, upper bank work queues 410 and lower bank work queues 420 for each bank of the SDRAM 200. The memory controller 400 may also maintain refresh counter portions 445A-445H for each memory bank array in the SDRAM 200. The refresh counter portions 445A-445H may be organized into upper bank counters 445E-445H and lower bank counters 445A-545E. Memory controller 400 may utilize upper bank counters 445E-445H and lower bank counters 445A-445E to keep track of upper bank refreshes separately from lower bank refreshes. Memory controller 400 may also utilize an upper bank precharge/refresh scheduler 450 and a lower bank precharge/refresh scheduler 460. The upper bank precharge/refresh scheduler 450 and the lower bank precharge/refresh scheduler 460 may operate utilizing a credit or debit model.

A credit model precharge/refresh scheduler begins by performing up to eight refreshes in a row (a credit balance), then uses up this balance as needed. The credit model scheduler generally tries to restore the credit balance back to eight whenever the memory subsystem is idle. A debit model precharge/refresh scheduler begins with a zero balance, and allows the controller to fall behind by as many as eight refreshes (a debit balance). The debit model scheduler generally tries to reduce the debit balance to zero whenever the memory subsystem is idle. The result of each type of scheduler is to perform precharge/refresh as much as possible during the memory subsystem idle times.

For example, using the credit model approach, either scheduler 450, 460 may be connected to a counter 445A-445D, 445E-445H, respectively, with a maximum count of 8 that is incremented each time a refresh occurs, and decremented every $t_{REFI}$ nsec. If the counter=8, then no more refreshes are needed for a specified time. If the counter=0, then a priority refresh has to occur (upper or lower). If the counter is between 1 and 7, then a precharge/refresh can be scheduled opportunistically whenever the upper empty signal 411 or lower empty signal 421 are asserted.

In embodiments of the present invention, the memory controller 400 in communication with the memory device may keep track of in which bank the PRECHARGE command is being performed. In an eight bank system, the knowledge of the current banks being precharged may be maintained by the memory controller 400. The memory controller 400 specifies the bank(s) to be precharged at the initiation of an PRECHARGE command with the address signal A10 and the BA signals (BA0, BA1, BA2) on the A10 address pin and the BA pins in a eight memory bank device. In embodiments of the present invention, only the banks specified to be precharged need to be idle at a given time. Thus, other commands may be performed on other banks not being precharged during a precharge operation on the specified banks. Other embodiments of the present invention may include restrictions as to which DRAM commands may be performed concurrently with the precharge or refresh commands, or concurrently during a specified phase of the refresh cycle $t_{RFC}$. For example, reads, writes and precharges may be allowed, but activate may be disallowed, in which case, pages must be left open in order for work to be done during the partial bank precharge or partial bank refresh.

The $t_{RP}$ time, shown in FIG. 3, representing the command period from a precharge to a REFRESH command can be utilized to perform commands in banks not being precharged.

For example, the precharging of the banks 0-3 memory arrays while an active and a read operation are performed in the bank 4 memory array is illustrated in timing diagram form in FIG. 3. As illustrated in FIG. 3, a PRECHARGE command is started by specifying banks 0-3 using the "lower bank precharge command" i.e., a precharge command with address A10 driven high, with BA2 driven high, and with BA0 driven low, will cause the lower four banks of the DRAM to be precharged. Subsequently, an ACTIVE command is started in bank 4 to activate the rows of the bank 4 memory array. A read command with a read latency of two is then performed to read data out from column n of the activated row. This transfer operation is performed before an auto refresh command is started by specifying banks 0-3 using a "lower bank refresh command" i.e., a partial bank refresh command as described in related U.S. patent application Ser. No. 10/713,486.

FIG. 3 shows an ACTIVE command and a READ command, but it will be understood that a write operation which writes data into SDRAM 200 or other operation could also be performed after the PRECHARGE command during the $t_{RP}$ time. In addition, the read operation is shown for one column of data, but may be extended to apply to a burst of length two, four, eight, or full page if the operation could be performed in the time represented by $t_{RP}$. The embodiments of SDRAM 200 described above refer to a eight memory bank device, but the present invention applies to any multi-bank synchronous memory device such as a sixteen memory bank device.

Figure 5:
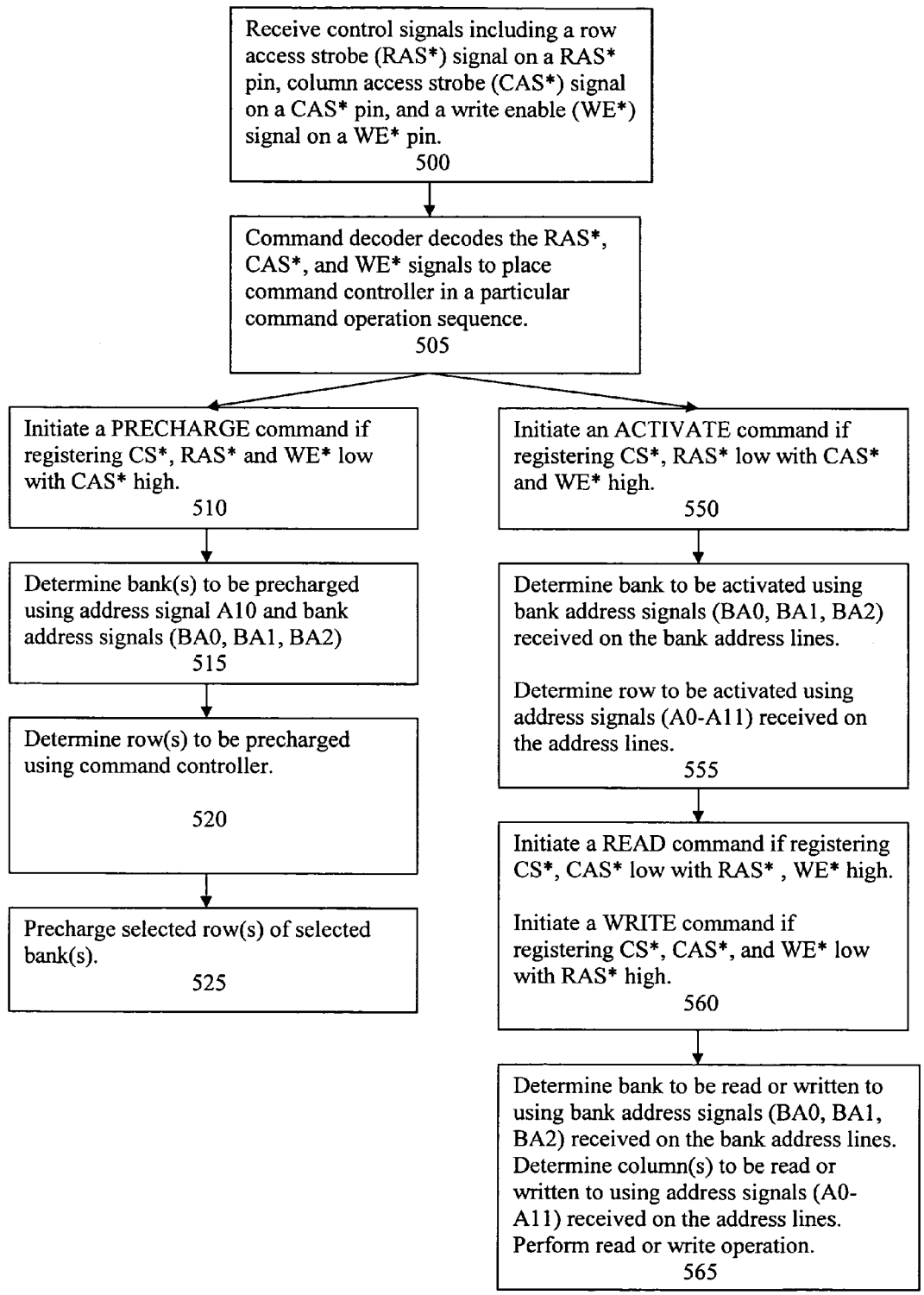
FIG. 5 illustrates a flow chart diagram of a partial bank precharge to a portion of the banks occurring along with an activate operation followed by a read or write operation according to an embodiment of the present invention.

FIG. 5 illustrates a flow chart diagram of a partial bank precharge to a portion of the banks occurring along with an activate operation followed by a read or write operation to a portion of the banks not being precharged. The SDRAM 200 receives 500 control signals including a row access strobe (RAS*) signal on a RAS* pin, column access strobe (CAS*) signal on a CAS* pin, and a write enable (WE*) signal on a WE* pin. The command decoder 260 decodes 505 the RAS*, CAS*, and WE* signals to place the command controller 280 in a particular command operation sequence. The command controller 280 will initiate 510 a PRECHARGE command if registering CS*, RAS* and WE* low with CAS* high. The command decoder 260 determines 515 the bank(s) to be precharged using the address signal received on address line A10 and bank address signals (BA0, BA1, BA2) received on the plurality of bank address lines. The command controller 280 determines 520 the row(s) to be precharged. The command controller 280 precharges 520 the row(s) of the memory bank(s) to be refreshed.

In addition, other commands may be performed on other banks not being precharged during a precharge operation on the banks specified to be precharge. The SDRAM 200 receives 500 control signals including a row access strobe (RAS*) signal on a RAS* pin, column access strobe (CAS*) signal on a CAS* pin, and a write enable (WE*) signal on a WE* pin. The command decoder 260 decodes 505 the RAS*, CAS*, and WE* signals to place the command controller 280 in a particular command operation sequence. The command controller 280 may initiate 550 an ACTIVATE command to a bank not being precharged if registering CS*, RAS* low with CAS* and WE* high. The command decoder 260 determines 555 the bank to be activated using bank address signals (BA0, BA1, BA2) received on the plurality of bank address lines and determines the row to be activated using address signals (A0-A11) received on the address lines. The command controller 280 may initiate 560 a READ command if registering CS*, CAS* low with RAS* and WE* high. Alternatively, the command controller 280 may initiate 560 a WRITE command if registering CS*, CAS*, and WE* low with RAS* high. The command decoder 260 determines 565 the bank to be read or written to using bank address signals (BA0, BA1, BA2) received on the bank address lines and determines the column (s) to be read or written to using address signals (A0-A11) received on the address lines. The SDRAM 200 then performs the read or write operation.

One embodiment involves instructions stored on a storage medium. A storage medium is implemented in hardware and can be either volatile or non-volatile storage. Examples of storage mediums include magnetic disk, optical disk, and DRAM.

While the description above refers to particular embodiments of the present invention, it will be understood that many modifications may be made without departing from the spirit thereof. The accompanying claims are intended to cover such modifications as would fall within the true scope and spirit of the present invention. The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A method of operating a memory device having multiple memory bank arrays utilizing a memory controller and being responsive to command signals, address signals, and a plurality of bank address signals, the method comprising:
   specifying, via a precharge scheduler in the memory controller, a plurality of the multiple memory bank arrays to be precharged using an address signal and a plurality of bank address signals, wherein the precharge scheduler operates using a credit model and the precharge scheduler is utilized to schedule precharges for only the specified plurality of memory banks; and
   initiating in response to first command signals a precharge command controlling a precharge operation to the specified plurality of memory banks, but not all of the multiple memory bank arrays, wherein the memory controller includes a counter for each of the specified plurality of memory banks, updates the counter each time a precharge occurs for the specified plurality of memory banks, and decrements the counter each time a refresh period has elapsed.

2. The method of claim 1, wherein if the counter reaches a maximum threshold, no more precharges are needed for a predetermined time.

3. The method of claim 1, wherein if the counter reaches a minimum threshold, a precharge is priority scheduled.

4. The method of claim 1, wherein the method is performed using a synchronous dynamic random access memory (SDRAM) device.

5. The method of claim 1, wherein if the counter is between a minimum threshold and a maximum threshold, a precharge is scheduled whenever work queues corresponding to the specified plurality of memory banks are empty.

6. An article comprising:
   a storage medium having stored thereon instructions that when executed by a machine result in the following:
   specifying, via a precharge scheduler in a memory controller, a plurality of memory banks of multiple memory bank arrays to be precharged using an address signal and a plurality of bank address signals, wherein the precharge scheduler operates using a credit model and the precharge scheduler is utilized to schedule precharges for only the specified plurality of memory banks; and
   initiating in response to first command signals a precharge command controlling a precharge operation to the specified plurality of memory banks, but not all of the multiple memory bank arrays, wherein the memory controller includes a counter for each of the specified plurality of memory banks, updates the counter each time a precharge occurs for the specified plurality of memory banks, and decrements the counter each time a refresh period has elapsed.

7. The article according to claim 6, wherein if the counter reaches a maximum threshold, no more precharges are needed for a predetermined time.

8. The article according to claim 6 wherein if the counter reaches a minimum threshold, a precharge is priority scheduled.

9. The article according to claim 6, wherein the method is performed using a synchronous dynamic random access memory (SDRAM) device.

10. The article according to claim 6, wherein if the counter is between a minimum threshold and a maximum threshold, a precharge is scheduled whenever work queues corresponding to the specified plurality of memory banks are empty.

11. A system responsive to command signals, address signals, and bank address signals, the system comprising:
    multiple memory bank arrays, each memory bank array having storage cells; and
    a memory controller including a precharge scheduler responsive to selected command signals, address signals, and bank address signals, to specify a plurality of memory bank arrays of the multiple memory bank arrays and to initiate a precharge command controlling a precharge operation to the specified plurality of memory bank arrays, but not all of the multiple memory bank arrays, the precharge scheduler is utilized to schedule precharge for only the specified plurality of memory bank arrays and the precharge scheduler operates using a credit model, wherein the memory controller includes a counter for each of the specified plurality of memory bank arrays, updates the counter each time a precharge occurs for the specified plurality of memory bank arrays, and decrements the counter each time a refresh period has elapsed.

12. The system of claim 11, where if the counter reaches a maximum threshold, no more precharges are needed for a predetermined time.

13. The system of claim 11, wherein if the counter reaches a minimum threshold, a precharge is priority scheduled.

14. The system of claim 11, wherein if the counter is between a minimum threshold and a maximum threshold, a precharge is scheduled whenever work queues corresponding to the specified plurality of memory banks are empty.

15. The system of claim 11, wherein the memory device is a synchronous dynamic random access memory (SDRAM).

16. A method of operating a memory device having multiple memory bank arrays utilizing a memory controller and being responsive to command signals, address signals, and a plurality of bank address signals, the method comprising:
    specifying, via a precharge scheduler in the memory controller, a plurality of the multiple memory bank arrays to be precharged using an address signal and a plurality of bank address signals;
    initiating in response to first command signals a precharge command controlling a precharge operation to the specified plurality of memory banks, but not all of the multiple memory bank arrays, wherein the precharge scheduler is utilized to schedule precharges for only the specific plurality of memory banks, and the precharge scheduler operates using a debit model; and
    initiating, before or during the precharge operation to the plurality of the specified memory bank arrays, a second command signal controlling a second operation, other than the precharge operation, to a third memory bank array of the multiple memory bank arrays, which is not one of the plurality of the specified memory bank arrays being precharged, wherein the memory controller includes a counter for each of the specified plurality of memory banks, updates the counter each time a precharge occurs for the specified plurality of memory banks, and decrements the counter each time a refresh period has elapsed.

17. The method of claim 16, wherein the method is performed using a synchronous dynamic random access memory SDRAM device.

18. The method of claim 16, wherein if the counter is zero, then no more precharges may be scheduled.

19. The method of claim 16, wherein if the counter reaches a negative maximum threshold, a precharge is priority scheduled.

20. A memory controller for controlling a memory device having multiple memory bank arrays comprising:
    a precharge scheduler to schedule a plurality of memory bank arrays of the multiple memory bank arrays to be precharged, the precharge scheduler being utilized to only schedule precharges for the specified plurality of memory bank arrays, wherein the precharge scheduler operates using a debit model;
    a processor for generating address signals, a plurality of bank address signals, first command signals, and second command signals, wherein the address signals and the plurality of bank address signals specify the plurality of memory bank arrays of the multiple memory bank arrays to be precharged, the first command signals initiate a precharge command controlling a precharge operation to the specified plurality of memory bank arrays, but not all of the multiple memory bank arrays, and the second command signals initiate, before or during the precharge operation to the plurality of specified memory bank arrays, a second command controlling a second operation, other than a precharge operation, to another memory bank array of the multiple memory bank arrays, which is not one of the specified plurality of memory bank arrays being precharged; and
    a counter for each of the specified plurality of memory bank arrays, wherein the counter is updated each time a precharge occurs for the specified plurality of memory banks, and decrements the counter each time a refresh period has elapsed.

21. The memory controller of claim 20, wherein if the counter is zero, then no more precharges may be scheduled.

22. The memory controller of claim 20, wherein the memory device is a synchronous dynamic random access memory (SDRAM) device.

23. The memory controller of claim 20, wherein if the counter reaches a negative maximum threshold, a precharge is priority scheduled.

24. The memory controller of claim 20, wherein if the counter is between zero and a negative maximum threshold, a precharge is scheduled whenever work queues corresponding to the specified plurality of memory bank arrays are empty.

25. A system comprising:
    a memory device having multiple memory bank arrays; and
    a memory controller for controlling the memory device, the memory controller including:

a precharge scheduler to schedule a plurality of memory bank arrays of the multiple memory bank arrays to be precharged, the precharge scheduler being utilized to only schedule precharges for the specified plurality of memory bank arrays and the precharge scheduler operates using a debit model;

a processor for generating address signals, a plurality of bank address signals, first command signals, and second command signals, wherein the address signals and the plurality of bank address signals specify the plurality of memory bank arrays of the multiple memory bank arrays to be precharged, the first command signals initiate a precharge command controlling a precharge operation to the specified plurality of memory bank arrays, but not all of the multiple memory bank arrays, and the second command signals initiate, before or during the precharge operation to the specified plurality of memory bank arrays, a second command controlling a second operation, other than a precharge operation, to another memory bank array of the multiple memory bank arrays, which is not one of the specified plurality of memory bank arrays being precharged; and a counter for each of the specified plurality of memory banks, updates the counter each time a precharge occurs for the specified plurality of memory banks, and decrements the counter each time a refresh period has elapsed.

26. The system of claim 25, wherein if the counter is zero, then no more precharges may be scheduled.

27. The system of claim 25, wherein the memory device is a synchronous dynamic random access memory SDRAM device.

28. The article according to claim 6, wherein if the counter reaches a negative maximum threshold, a precharge is priority scheduled.

29. The system of claim 28, wherein if the counter is between zero and the negative maximum threshold, a precharge is scheduled whenever work queues corresponding to the specified plurality of memory bank arrays are empty.

* * * * *